US012065355B2

United States Patent
Omachi et al.

(10) Patent No.: US 12,065,355 B2
(45) Date of Patent: Aug. 20, 2024

(54) METHOD FOR SEPARATING SEMICONDUCTING CARBON NANOTUBES, AND MIXED SOLUTION, AND DISPERSION OF SEMICONDUCTING CARBON NANOTUBES

(71) Applicants: NATIONAL UNIVERSITY CORPORATION TOKAI NATIONAL HIGHER EDUCATION AND RESEARCH SYSTEM, Nagoya (JP); NAGASE VIITA CO., LTD., Okayama (JP)

(72) Inventors: Haruka Omachi, Nagoya (JP); Hisanori Shinohara, Nagoya (JP); Hikaru Watanabe, Okayama (JP)

(73) Assignees: NATIONAL UNIVERSITY CORPORATION TOKAI NATIONAL HIGHER EDUCATION AND RESEARCH SYSTEM, Nagoya (JP); NAGASE VIITA CO., LTD., Okayama (JP)

( * ) Notice: Subject to any disclaimer, the term of this patent is extended or adjusted under 35 U.S.C. 154(b) by 736 days.

(21) Appl. No.: 17/277,525

(22) PCT Filed: Aug. 8, 2019

(86) PCT No.: PCT/JP2019/031297
§ 371 (c)(1),
(2) Date: Mar. 18, 2021

(87) PCT Pub. No.: WO2020/059348
PCT Pub. Date: Mar. 26, 2020

(65) Prior Publication Data
US 2021/0354988 A1 Nov. 18, 2021

(30) Foreign Application Priority Data
Sep. 19, 2018 (JP) ................. 2018-175227

(51) Int. Cl.
*C01B 32/159* (2017.01)
*C01B 32/172* (2017.01)
(Continued)

(52) U.S. Cl.
CPC .......... *C01B 32/159* (2017.08); *C01B 32/172* (2017.08); *C01B 32/174* (2017.08);
(Continued)

(58) Field of Classification Search
CPC ... C01B 32/159; C01B 32/172; C01B 32/174; C01B 2202/00; C01B 2202/02;
(Continued)

(56) References Cited

U.S. PATENT DOCUMENTS

2008/0242854 A1* 10/2008 Mizu ................. B82Y 30/00
536/123.12
2010/0120710 A1  5/2010 Watanabe et al.
(Continued)

FOREIGN PATENT DOCUMENTS

WO    2008/136331 A1    11/2008

OTHER PUBLICATIONS

Fu, et al., Why do the structural properties of complexes formed by glucans and carbon nanotubes differ so much? RSC Adv. 2015; 5: 95682-95689 (Year: 2015).*

(Continued)

*Primary Examiner* — Daniel C. McCracken
(74) *Attorney, Agent, or Firm* — Oliff PLC

(57) ABSTRACT

To reduce cost for the method for separating semiconducting carbon nanotube from a mixture of metallic and semiconducting carbon nanotubes. The separation method includes preparing a dispersion by mixing a first substance, a second substance, SDS, SC, and a mixture of metallic and semiconducting carbon nanotubes with a solvent, wherein the dispersion into two layers, which are a first layer mainly (Continued)

containing the first substance and a second layer mainly containing the second substance, whereby the semiconducting carbon nanotube is transferred into the first layer, and the metallic carbon nanotube is transferred into the second layer, wherein the first substance is an α-glucan which is composed of glucose linked via α-glucosidic linkage and which has a weight average molecular weight Mw of 4,000 to 7,000 and has a ratio in amount of α-1, 6 linked glucose residues to the entire glucose residues of 40 to 70%.

3 Claims, 8 Drawing Sheets

(51) Int. Cl.
 *C01B 32/174* (2017.01)
 *H10K 85/20* (2023.01)
(52) U.S. Cl.
 CPC ........ *H10K 85/221* (2023.02); *C01B 2202/00* (2013.01); *Y10S 977/742* (2013.01); *Y10S 977/842* (2013.01); *Y10S 977/845* (2013.01)
(58) Field of Classification Search
 CPC .............. C01B 2202/22; H10K 85/221; Y10S 977/742; Y10S 977/842; Y10S 977/845; B82Y 40/00

See application file for complete search history.

(56) References Cited

U.S. PATENT DOCUMENTS

2014/0174991 A1\* 6/2014 Khripin ................. C01B 32/172
 977/845
2018/0215991 A1\* 8/2018 Kadhum ............. E21B 47/0025

OTHER PUBLICATIONS

Jan. 10, 2023 Office Action Issued in Japanese Patent Application No. 2020-548111.
Oct. 21, 2019 International Search Report issued in International Patent Application No. PCT/JP2019/031297.
Constantine Y Khripin, et al, "Spontaneous Partition of Carbon Nanotubes in Polymer-Modified Aqueous Phases" J. Am. Chem. Soc. 2013, 135, pp. 6822-6825.

\* cited by examiner

METHOD FOR SEPARATING SEMICONDUCTING CARBON NANOTUBES, AND MIXED SOLUTION, AND DISPERSION OF SEMICONDUCTING CARBON NANOTUBES

TECHNICAL FIELD

The present disclosure relates to a method for separating semiconducting carbon nanotube from a mixture of metallic and semiconducting carbon nanotubes.

BACKGROUND ART

Carbon nanotube (CNT) is a substance formed of a cylindrically rolled graphene sheet in which carbon atoms are bonded to form a honeycomb structure. In the case of a single-layer cylindrical structure, the CNT is called a single-walled carbon nanotube (SWCNT), and in the case of a multi-layer cylindrical structure, the CNT is called a multi-walled carbon nanotube (MWCNT). By virtue of high electric conductivity and favorable material characteristics such as high flexibility and stand-by stability, carbon nanotube is a promising material for flexible device applications. As used herein, unless otherwise specified, the term "carbon nanotube" refers to a single-walled carbon nanotube.

The structure (i.e., conduction type) of carbon nanotube is determined to be metallic or semiconducting depending on the direction of the rolling vector of a graphene sheet (i.e., chirality). Semiconducting carbon nanotube is expected to serve as a material of semiconductor devices such as transistors. By use of semiconducting carbon nanotube, semiconductor devices such as transistors can be fabricated through simple steps (e.g., coating and printing), whereby an increased device area and reduction in production cost cart be achieved. In addition, since semiconducting carbon nanotube can be applied to a low-temperature process, a semiconductor device can be formed on a plastic film substrate, to thereby provide a flexible device.

There have been known several carbon nanotube production techniques, including laser ablation, CVD, and arc discharge. In such conventional techniques, the formed carbon nanotube assumes a mixture of metallic and semiconducting carbon nanotubes. As a result, semiconducting carbon nanotube must be isolated from the mixture for use as a semiconductor material.

For isolating semiconducting carbon nanotube, there have been proposed a variety of techniques. One known technique is column chromatography employing a column filled with gel. Also, Patent Document 1 and Non-Patent Document 1 disclose a separation method employing an aqueous two-phase separation system.

Patent Document 1 discloses the following procedure of separating semiconducting carbon nanotubes. Firstly, a carbon nanotube dispersion is added to a solution containing dextran (DX), polyethylene glycol (PEG), and sodium dodecyl sulfate (SDS), and the mixture is stirred. The resultant dispersion is separated through centrifugation into a PEG upper layer and a DX lower layer so that carbon nanotubes are present in the upper layer. Subsequently, the dispersion is titrated with sodium cholate (SC). As a result, semiconducting carbon nanotubes having a specific structure of interest is left in the upper layer, and semiconducting carbon nanotubes of other structures and metallic carbon nanotubes are transferred into the lower layer. Thus, semiconducting carbon nanotubes of interest can be isolated in the upper layer.

Non-Patent Document 1 discloses a procedure which includes adding DX, PEG, SDS, SC, and carbon nanotubes dispersed in SC into water, and centrifuging the mixture to be separated into a PEG upper layer and a DX lower layer, to thereby isolate semiconducting carbon nanotube in the upper layer. The document also discloses that the results of the separation process are the same regardless of the chronological order of adding the components.

Patent Document 2 discloses an α-glucan in which glucose molecules are linked via α-glucosidic linkages, wherein the ratio of the sum of the α-1, 4 linked glucose residues and α-1, 6 linked glucose residues, and the ratio of α-1, 6 linked glucose residues to α-1, 4 linked glucose residues fall within specific ranges.

PRIOR ART DOCUMENTS

Patent Documents

Patent Document 1: US Patent Application Laid-Open. No. 2014/0174991
Patent Document 2: WO 2008/136331

Non-Patent Documents

Non-Patent Document 1: Constantine Y Khripin, et al, J. Am. Chem. Soc, 2013, 135, 6822-6825

SUMMARY OF THE INVENTION

Problems to be Solved by the Invention

In a conventional column chromatographic semiconducting carbon nanotube separation method, only a batch of a small amount of carbon nanotubes can be handled. Thus, difficulty is encountered in applying such a separation method to industrial processes, in terms of productivity and cost.

Also, the procedures disclosed in Patent Document 1 and Non-Patent Document 1 have a problem of cost due to use of expensive DX. Thus, demand has arisen for a low-cost DX substitute material that can maintain separation performance.

Patent Document 2 discloses uses of α-glucan including a blood glucose rise inhibitor and an in vivo lipid reducing agent. However, Patent Document 2 fails to disclose that α-glucan can be used in separation of semiconducting carbon nanotubes.

Meanwhile, the present inventors previously found another problem through their studies. Specifically, when semiconducting carbon nanotube is separated through two-phase separation employing a DX-containing solution a long time after preparation thereof, the semiconducting carbon nanotube separation performance is reduced. That is, when DX is used, the semiconducting carbon nanotube separation performance is deteriorated over time (i.e., the semiconducting carbon nanotube separation performance is not consistent). The reusability of the solution is poor.

Thus, an object of the present disclosure is to reduce the cost of a method for separating semiconducting carbon nanotube from a mixture of metallic and semiconducting carbon nanotubes. Another object is to enhance the consistency of semiconducting carbon nanotube separation performance and reusability of the solution.

Means for Solving the Problems

The present inventors have carried out extensive studies on α-glucan, which can substitute for DX conventionally used in a semiconducting carbon nanotube separation method through two-phase separation. As a result, the inventors have found that the semiconducting carbon nanotube separation performance based on the two-phase separation technique considerably depends on the α-1, 6 linked glucose residue content of α-glucan. The semiconducting carbon nanotube separation method of the present disclosure has been accomplished on the basis of this finding.

Accordingly, the present disclosure is directed to a semiconducting carbon nanotube separation method characterized in that the method comprises a first step of mixing a first substance, a second substance which undergoes two-phase separation when mixed with the first substance in a state of solution, an alkyl chain-containing surfactant, a steroidal surfactant, and a mixture of metallic and semiconducting carbon nanotubes with a solvent, to thereby prepare a dispersion; and a second step of separating the dispersion into two layers, which are a first layer mainly containing the first substance and a second layer mainly containing the second substance, whereby the semiconducting carbon nanotube is transferred into one of the first layer and the second layer, and the metallic carbon nanotube is transferred into the other of the first layer and the second layer, wherein the first substance is an α-glucan which is composed of glucose linked via α-glucosidic linkage and which has a weight average molecular weight Mw of 4,000 to 7,000 and has a ratio in amount of α-1, 6 linked glucose residues to the entire glucose residues of 40 to 70%.

Effects of the Invention

According to the present disclosure, semiconducting carbon nanotube can be separated from a mixture of metallic and semiconducting carbon nanotubes at low cost. The semiconducting carbon nanotube separation performance of the present disclosure is equivalent to or higher than that obtained by use of DX. In addition, deterioration of semiconducting carbon nanotube separation performance over time (i.e., a drop in semiconducting carbon nanotube separation performance after passage of time from preparation of a first substance-containing solution used in two-phase separation) is prevented, and the consistency in semiconducting carbon nanotube separation performance is enhanced. Thus, reusability of the solution can also be enhanced.

MODES FOR CARRYING OUT THE INVENTION

First Embodiment

The first embodiment is directed to a method for separating semiconducting carbon nanotube from a mixture of metallic and semiconducting carbon nanotubes.

The first embodiment is a separation method based on two-phase separation. The term "two-phase separation" refers to a phenomenon that two separate phases are generated when two substances are mixed with a solvent. In the present disclosure, one of the two substances is referred to as a "first substance," and the other of them is referred to as a "second substance." These substances will next be described in detail.

(First Substance)

Figure 1:
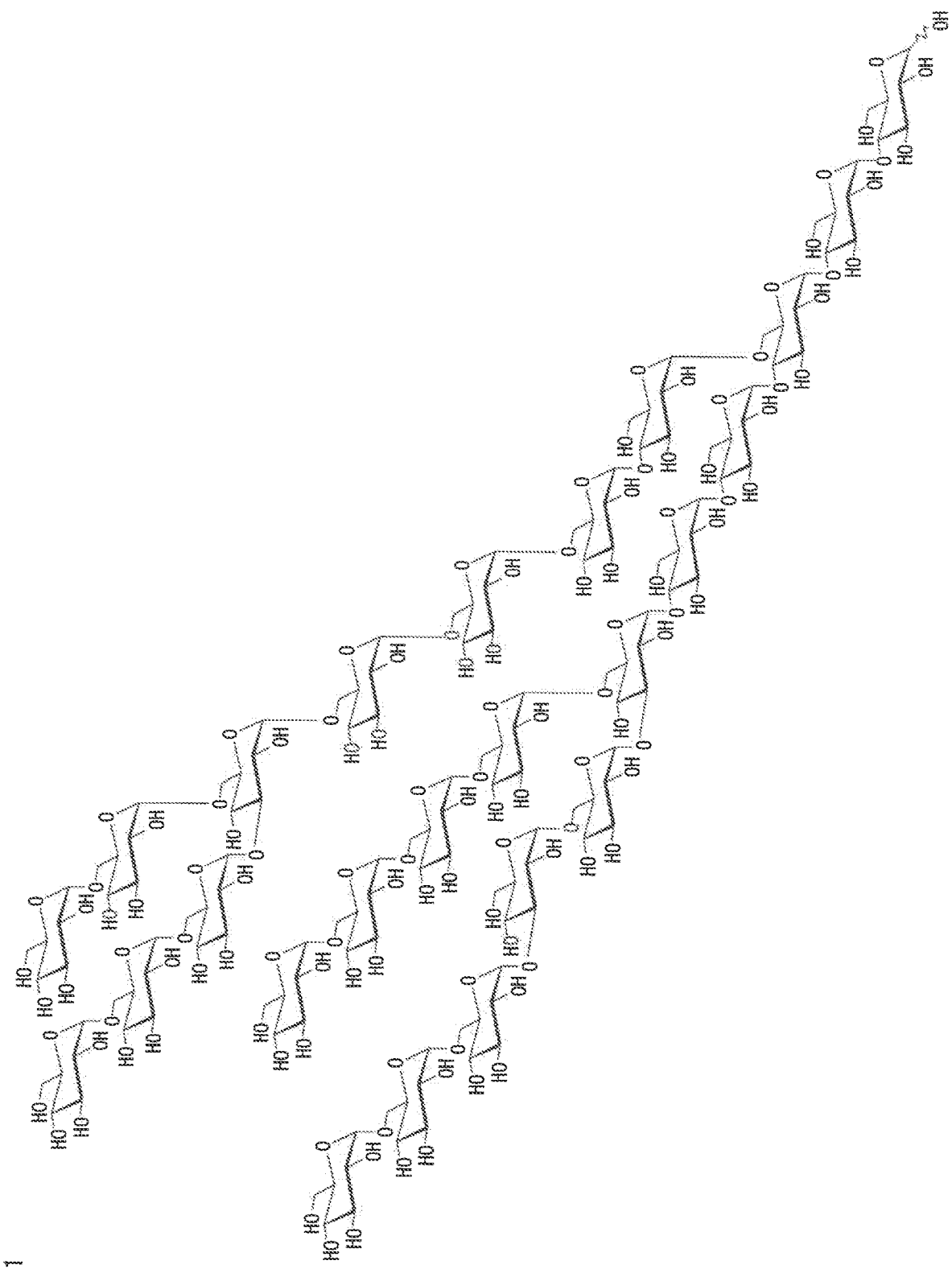
FIG. 1 Schematic structure of α-glucan employed in first embodiment.

The first substance is an α-glucan having a specific structure. FIG. 1 schematically shows an example of the structure of the first substance. The first substance is an α-glucan which is composed of glucose linked via α-glucosidic linkage and which has a weight average molecular weight Mw of 4,000 to 7,000 and has a ratio of in amount of α-1, 6 linked glucose residues to the entire glucose residues of 40 to 70%. The term "α-1, 6 linked glucose residue" refers to a glucose residue linked with adjacent glucose residues only via the hydroxy group of C-1 position and the hydroxy group of C-1 position. The α-1, 6 linked glucose residue content can be determined through, for example, a methylation analysis (see, for example, Patent Document 2 for details of the analysis). The weight average molecular weight Mw can be determined through, for example, size exclusion chromatography or the like. The average polymerization degree can be calculated from the weight average molecular weight Mw.

An α-glucan having a weight average molecular weight Mw and an α-1, 6 linked glucose residue content which fall within the above ranges can be substituted for DX conventionally used in a semiconducting carbon nanotube separation method based on aqueous two-phase separation. Also, a semiconducting carbon nanotube separation performance equivalent to or higher than that obtained by use of DX can be achieved.

Since the first substance is less expensive than DX, the cost of the semiconducting carbon nanotube separation method can be reduced.

The weight average molecular weight Mw of the first substance determines the viscosity or the like of the solution of the first substance dissolved in a solvent; i.e., ease of separation operation and other factors. The higher the weight average molecular weight, the higher the semiconducting carbon nanotube separation performance. The weight average molecular weight MW is more preferably 5,000 to 7,000, still more preferably 6,000 to 7,000.

In the first substance, the ratio in amount of α-1, 6 linked glucose residues to the entire glucose residues determines the separation performance in the semiconducting carbon nanotube separation method employing aqueous two-phase separation. Particular when the first substance has a structure in which glucose residues are continuously bound in an α-1, 6 linkage mode from the non-reducing end, semiconducting carbon nanotube separation performance can be enhanced. When the first substance has an α-1, 6 linked glucose residue amount of 40% or greater, a semiconducting carbon nanotube separation performance equivalent to or higher than that obtained by use of DX can be achieved. Also, when the first substance has an α-1, 6 linked glucose residue amount of 70% or less, production cost can be sufficiently reduced, as compared with the case of use of DX. The α-1, 6 linked glucose residue ratio is more preferably 41 to 65%, still more preferably 43 to 60%, most preferably 45 to 55%. Other than α-1, 6 linked glucose residues, the ratio in amount of α-1, 6 linkage-containing glucose residues including α-1, 3, 6 bound glucose residues and α-1, 4, 6 bound glucose residues (with respect to the entire glucose residues) is preferably high, from the viewpoint of enhancing the semiconducting carbon nanotube separation performance. For example, the ratio in amount of α-1, 6 linkage-containing glucose residues is preferably 50% or higher, more preferably 60% or higher, still more preferably 65% or higher.

In the first substance, the ratio in amount of α-1, 4 linked glucose residues to the entire glucose residues is preferably controlled to 10 to 25%. The term "α-1, 4 linked glucose residue" refers to a glucose residue linked with adjacent glucose residues only via the hydroxy group of C-1 position and the hydroxy group of C-4 position. The α-1, 4 linked glucose residue content can be determined through a methylation analysis. The reason for the preference of the above range is as follows. When the relative amount of glucose residues other than α-1, 4 linked glucose residues is larger, cost for producing the first substance tends to increase, whereas when the α-1, 4 linked glucose residue content is larger, the α-1, 6 linked glucose residue content relatively and excessively decreases, to thereby impair semiconducting carbon nanotube separation performance. Thus, the ratio in amount of α-1, 4 linked glucose residues is more preferably 11 to 24%, still more preferably 13 to 22%.

In the first substance, the ratio in amount of the sum of α-1, 4 linked glucose residues and α-1, 6 linked glucose residues to the entire glucose residues is preferably 55% or greater, more preferably 60 to 72%, still more preferably 63 to 69%.

The first substance can have a branching structure. The presence and the ratio of branching do not greatly affect the semiconducting carbon nanotube separation performance in the first embodiment. However, in consideration of deterioration of the solution of the first substance mixed with a solvent, the branching ratio is preferably 8 to 27%. As used herein, the term "branching ratio" refers to the ratio of >3 linked glucose residues to the entire glucose residues. The branching ratio can be determined through a methylation analysis. The branching ratio is more preferably 10 to 25%, still more preferably 12 to 23%.

When the first substance has a branching structure, preferably, the branching structure is linked, via a linkage other than α-1, 4 linkage, to a non-reducing end glucose residue which is present at one end of the linear glucan having a polymerization degree of ≥3 with α-1, 4 linkage. Examples of the linkage other than α-1, 4 linkage include α-1, 6 linkage, α-1, 2 linkage, and α-1,3 linkage.

In the first substance, the ratio in amount of α-1, 6 linked glucose residues to α-1, 4 linked glucose residues is preferably 60 to 400%.

Also, in the first substance, the ratio in amount of α-1, 3 linked glucose residues to the entire glucose residues is preferably 0.5 to 10%. The term "α-1, 3 linked glucose residue" refers to a glucose residue linked with adjacent glucose residues only via the hydroxy group of C-1 position and the hydroxy group of C-3 position. The ratio is more preferably 1 to 7%.

Further, in the first substance, the ratio in amount of α-1, 3, 6 linked glucose residues to the entire glucose residues is preferably 0.5% or more. The term "α-1, 3, 6 linked glucose residue" refers to a glucose residue linked with adjacent glucose residues only via the hydroxy group of C-1 position, the hydroxy group of C-3 position, and the hydroxy group of C-1 position. The ratio is more preferably 5 to 15%.

In the first substance, the ratio of the weight average molecular weight Mw to the number average molecular weight Mn (Mw/Mn) is preferably as small as possible. In the case where Mw/Mn is nearly equal to 1, variation in polymerization degree is smaller. Thus, the smaller the Mw/Mn, the smaller the variation in structure of the first substance. In other words, variation in semiconducting carbon nanotube separation performance in the first embodiment is reduced. Mw/Mn is preferably <20, more preferably ≤10, still more preferably ≤5.

Preferably, the first substance has a structure to form isomaltose through isomalto-dextranase digestion in an amount of 10 wt % or more, based on the digestive product (solid content). The concent "isomalto-dextranase digestion" refers to hydrolysis of the first substance by the action of isomalto-dextranase. Isomalto-dextranase is an enzyme having an enzyme commission number (EC) 3.2.1.94 and can hydrolyze any of α-1, 2, α-1,3, α-1, 4, and α-1, 6 linkages adjacent to the reducing end of the isomaltose moiety of α-glucan.

The isomaltose moiety content of the first substance serves as an index for indicating that the first substance has a complex branching structure; i.e., resistance to retrogradation. That is, so long as the first substance forms isomaltose through isomalto-dextranase digestion in an amount of 10 wt % or more based on the digestive product (solid content), the solution of the first substance mixed with a solvent is resistive to retrogradation, which is more favorable in separation operation. The isomaltose moiety content is more preferably 10 to 70 wt %, still more preferably 15 to 60 wt %, most preferably 20 to 50 wt %.

Also, the first substance preferably has a water-soluble dietary fiber content of 40 wt % or higher, which is determined through high performance liquid chromatography (enzyme-HPLC method). The chromatography (enzyme-HPLC method) refers to a method disclosed in MHLW Notification No. 146 (May, 1996), Nutrition Label Standards, 8. "Dietary fiber" in "Analytical Method for Nutrient Components, etc. (a method disclosed in column 3 of attached Nutrition Label Standards Table 1)."

The water-soluble dietary fiber content of the first substance is an index for indicating that the first substance has a digestion-resistant structure (i.e., a complex branching structure). That is, the content serves as an index for retrogradation resistance of the first substance. When the water-soluble dietary fiber content of the first substance is 40 wt % or higher, the solution of the first substance mixed with a solvent is resistive to retrogradation. The water-soluble dietary fiber content is more preferably 50 to 95 wt %, still more preferably 60 to 90 wt %, most preferably 70 to 85 wt %.

The first substance can be produced through any production method, so long as it has the aforementioned structure. In one production method, the first substance can be produced by causing an enzyme of interest to act on starch (see, for example, a production method disclosed in Patent Document 2). Thus, the first substance is less expensive than DX.

(Second Substance)

The second substance will next be described. Any material can be used as the second substance, so long as the material is soluble in a solvent and undergoes two-phase separation when mixed with the first substance in the solvent. The second substance can be a polymer or a low-molecular weight substance. The polymer is a polymerized product of monomers and also includes a high-molecule compound and an oligomer, as well as a copolymer. Examples of the polymer which can be used include polyether, a polysaccharide, and a derivative thereof.

In the case where the second substance is a non-electrolyzable polymer, specific examples include polypropylene glycol, polyethylene glycol (PEG), poly (vinyl alcohol), polyvinylpyrrolidone, methylcellulose, hydroxyethylcellulose, hydroxypropylated dextran, and Ficoll.

In the case where the second substance is an electrolyzable polymer, specific examples include sodium dextran sulfate.

In the case where the second substance is a low-molecular weight substance, specific examples include butylene glycol and propanol.

Among these second substances, PEG is particularly preferred, from the viewpoints of high semiconducting carbon nanotube separation performance and ease of handling and availability.

(Steps Involved in Semiconducting Carbon Nanotube Separation)

Figure 2:
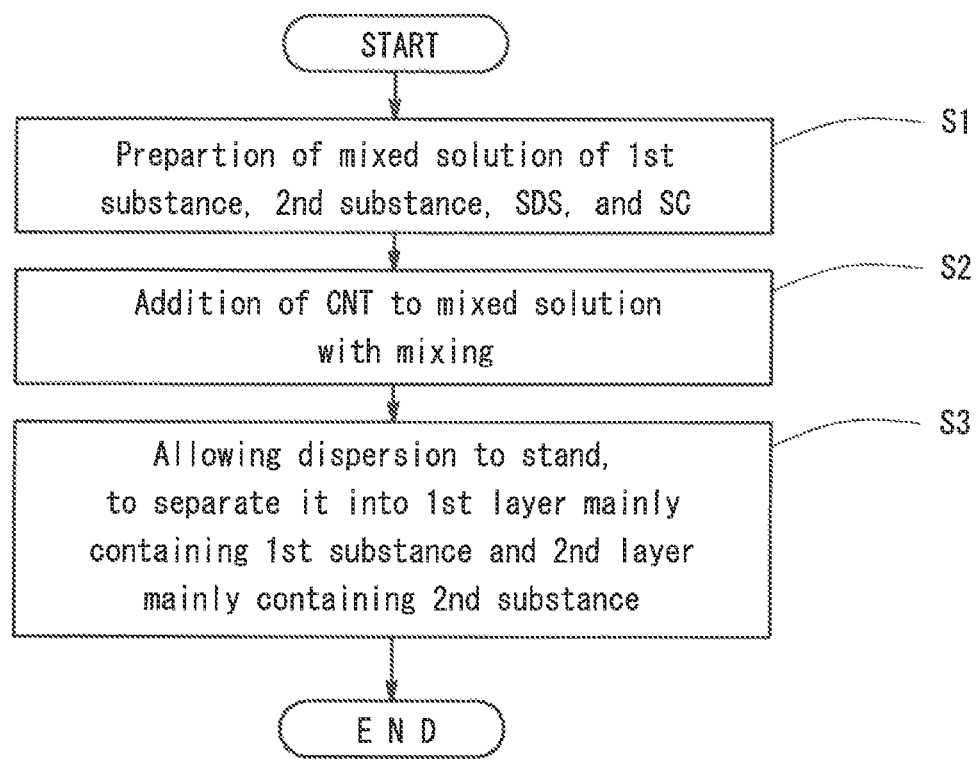
FIG. 2 Flowchart of separation steps in first embodiment.

With reference to FIG. 2, the semiconducting carbon nanotube separating steps will be described in the order of the flowchart.

(Step S1)

Firstly, a first substance, a second substance, SDS, and SC are mixed with a solvent, to thereby prepare a mixed solution (Step S1 in FIG. 2). Any chronological order can be applied to mixing the ingredients.

Notably, so long as the system provides at least two layers, 3 or more substances can be used. In such a case, the same method as employed in the first embodiment can be applied. For the convenience of description, among two layers, the substance mainly contained in the layer for recovery of semiconducting carbon nanotube is denoted as the "second substance," and the other substance is denoted as the "first substance."

Water is generally used as a solvent. However, any material which can disperse carbon nanotube (e.g., heavy water or alcohol) can also be used.

The first substance concentration and the second substance concentration of the mixed solution can be adjusted, so long as the mixed solution can undergo two-phase separation. The concentration which allows the solution to separate into two phases can be determined through a known method based on a state diagram. The term "state diagram" denotes a phase diagram with a horizontal axis representing one of the first and second substance concentrations and the vertical axis representing the other concentration. In the phase diagram, when the total composition of the first and second substances is present in a region above the bi-nodal curve, two-phase separation occurs. The bi-nodal curve indicates the boundary of phase separation. When the total composition has been determined, the first substance concentration and the second substance concentration in each phase after phase separation are determined. In other words, a tie line passing through points of the total composition (i.e., a line representing the equilibrium between two phases) crosses with the bi-nodal curve at two points. The concentrations at the two intersection points correspond to the first substance concentrations and the second substance concentrations in respective phases.

The SDS concentration and the SC concentration are regulated in accordance with chirality and length of the semiconducting carbon nanotube to be isolated. For example, the SDS concentration and the SC concentration can be regulated separately or can be regulated by the SDS/SC concentration ratio.

The temperature of the mixed solution is essentially room temperature or thereabout and can be adjusted to 5 to 55° C. Under the above temperature conditions, semiconducting carbon nanotube can be efficiently separated. The temperature is more preferably 20 to 35° C., still more preferably 25 to 30° C.

(Step S2)

Next, a mixture of metallic and semiconducting carbon nanotubes is added to the mixed solution, and the mixture is stirred (Step S2 in FIG. 2). Although carbon nanotube per se is hydrophobic, it can be dissolved in the mixed solution through incorporation into micelle of SDS or SC serving as a surfactant. Carbon nanotube is essentially added before occurrence of separation of the mixed solution into two layers; a first layer mainly containing the first substance and a second layer mainly containing the second substance. Thus, a carbon nanotube dispersion is prepared.

Carbon nanotube can be produced through any method, and carbon nanotube produced through arc discharge, laser ablation, CVD, etc. can be used.

No particular limitation is imposed on the concentration of the carbon nanotube dispersion, and the carbon nanotube concentration can be adjusted so as to ensure the dispersion state.

(Step S3)

Next, the dispersion is allowed to stand, to thereby separate the dispersion into two layers; a first layer mainly containing the first substance and a second layer mainly containing the second substance. Notably, in order to shorten the time for separating the dispersion into the first layer and the second layer, centrifugation can be added by means of a centrifuge.

The hydrophobicity of carbon nanotube varies depending on the chirality and length thereof. Thus, a difference in interaction of semiconducting carbon nanotube and metallic carbon nanotube with SDS and SC is observed. As a result, the hydrophilicity of the micelle enclosing carbon nanotube varies depending on the chirality and length of the enclosed carbon nanotube. Based on the difference in hydrophilicity, in separation of the dispersion into two layers, a semiconducting carbon nanotube moves to either of the first layer or the second layer, depending on the length and chirality thereof. Also, a metallic carbon nanotube moves to the first layer.

The purity, length, and chirality of the semiconducting carbon nanotube transferred to the second layer can be regulated by the SDS/SC concentration ratio. The higher the SC concentration, the higher the separation performance. In this case, the semiconducting carbon nanotube concentration of the second layer decreases. In contrast, the lower the SC concentration, the lower the separation performance. In this case, the semiconducting carbon nanotube concentration of the second layer increases.

Through removal of the second layer separated from the dispersion, semiconducting carbon nanotube having a length and chirality of interest can be separated at high selectivity from a mixture of metallic and semiconducting carbon nanotubes. The separation method of the first embodiment provides high semiconducting carbon nanotube separation performance. For example, the ratio in amount of semiconducting carbon nanotube in the second layer can be elevated to 95 wt % or higher with respect to all carbon nanotubes present in the second layer.

The separation method of the first embodiment provides a separation performance higher than that attained through a conventional separation method in which SC is added to a dispersion containing a first substance, a second substance, SDS, and carbon nanotube. A conceivable reason therefor is as follow.

According to a conventional method, carbon nanotube is added to a solution containing a first substance, a second substance, and SDS, and then SC is added thereto. Thus, conceivably, carbon nanotube firstly interacts with SDS; the entirety or a part of SDS is then substituted by SC; and carbon nanotube also interacts with SC.

In contrast, according to the first embodiment, carbon nanotube is mixed with a mixed solution in which both SDS and SC have been present. As a result, carbon nanotube interacts simultaneously with SDS and SC.

As described above, there is a difference in the timing of interaction of carbon nanotube with SDS and SC between the unconventional method and the first embodiment. Accordingly, there may also be a difference in the mode of interaction of carbon nanotube with SDS and SC. By virtue of the difference in interaction mode, the separation performance of the first embodiment is assumed to be enhanced as compared with the conventional method.

Notably, in a preferred manner, SC is further added to the dispersion containing the isolated semiconducting carbo nanotube, since aggregation of semiconducting carbon nanotubes present in the dispersion is prevented in the passage of time, whereby semiconducting carbon nanotubes can be uniformly dispersed in the dispersion. In this case, a 0.1 to 10 wt % aqueous SC solution is preferably added in a volume equivalent to or greater than the volume of the separation liquid, more preferably in a volume ≥3 times the volume of the separation liquid. Also, a dispersant other than SC can be added, so long as the dispersant can disperse semiconducting carbon nanotube.

As mentioned hereinabove, in the first embodiment, α-glucan having a specific structure is used instead of conventional LX. As a result, semiconducting carbon nanotube can be easily separated from a mixture of metallic and semiconducting carbon nanotubes at a separation performance equivalent or higher than that obtained in the case of DX. In addition, since α-glucan having a specific structure serving as the first substance used in the first embodiment is less expensive than DX, semiconducting carbon nanotube can be isolated at lower cost.

Alternatively, the removed second layer (i.e., a dispersion containing the second substance and semiconducting carbon nanotube) is separated again into two layers by adding the first substance thereto, whereby the length and chirality of the semiconducting carbon nanotubes can be controlled in a more regulated manner.

Still alternatively, the carbon nanotubes present in the first layer are removed, and subjected again to the separation method of the first embodiment with modification of SDS and SC concentrations, whereby semiconducting carbon nanotubes having different length and chirality remaining in the first layer can be isolated.

When a solution containing α-glucan which has a specific structure and which serves as the first substance of the first embodiment is used, over-time deterioration of semiconducting carbon nanotube separation performance is suppressed, as compared with the case of DX. That is, the semiconducting carbon nanotube separation performance is highly consistent. The phenomenon "over-time deterioration of separation performance" refers to that, when semiconducting carbon nanotube is separated through two-phase separation employing a solution cotaining α-glucan or DX a long time after preparation thereof, the semiconducting carbon nanotube separation performance is undesirably reduced. Thus, according to the first embodiment, even when the solution is repeatedly used in semiconducting carbon nanotube separation, deterioration of separation performance is prevented by virtue of highly consistent semiconducting carbon nanotube separation performance. Thus, reusability of the solution is enhanced.

Modification of First Embodiment

As shown in FIG. 2, in the first embodiment, the first substance, the second substance, SDS, and SC are mixed with a solvent, to thereby prepare a mixed solution, and the carbon nanotube is added to the solution, to thereby prepare a dispersion. However, no particular limitation is imposed on the chronological order of mixing of the ingredients, and any order can be employed.

For example, the mixing order as described in Patent Document 1 can be employed. In an alternative manner, the first substance, the second substance, SDS, and carbon nanotube are mixed with a solvent, and then SC is added.

Any mixing order achieves a separation performance equivalent to or higher than that obtained in the case where the first substance is substituted by DX.

However, in order to further enhance semiconducting carbon nanotube separation performance and mass-productivity, the mixing order is preferably the order as employed in the first embodiment.

In the first embodiment, SDS and SC are used as a surfactant for solubilizing carbon nanotube in a solvent. However, a steroidal surfactant (i.e., a surfactant having a steroid skeleton) can also be used instead of SC. Examples of the steroidal surfactant which can be used include sodium glycocholate, sodium deoxycholate, sodium taurocholate, sodium chenodeoxycholate, and 3-[(3-cholamidopropyi)dimethylammonio]-1-propanesulfonate (CHAPS). Alternatively, an alkyl chain-containing surfactant (i.e., a surfactant having a linear-chain alkyl group) can also be used instead of SDS. Examples of the alkyl chain-containing surfactant which can be used include sodium myristyl sulfate, sodium laureth sulfate, sodium lauryl phosphate, sodium laurate, and sodium N-lauroylsarcosinate.

Second Embodiment

The second embodiment is directed to a mixed solution for use in separating semiconducting carbon nanotube from a mixture of metallic and semiconducting carbon nanotubes through two-phase separation, characterized in that the mixed solution comprises a first substance, a second substance which undergoes two-phase separation when mixed with the first substance in a state of solution, an alkyl chain-containing surfactant, a steroidal surfactant, and a solvent, wherein the first substance is an α-glucan which is composed of glucose linked via α-glucosidic linkage and which has a weight average molecular weight Mw of 4,000 to 7,000 and has a ratio in amount of α-1, 6 linked glucose residues to the entire glucose residues of 40 to 70%. In the second embodiment, details of the first substance, the second substance, the alkyl chain-containing surfactant, and the steroidal surfactant are the same as described in the first embodiment.

Third Embodiment

The third embodiment is directed to a dispersion for separating semiconducting carbon nanotube from a mixture of metallic and semiconducting carbon nanotubes through two-phase separation, characterized in that the dispersion comprises a first substance, a second substance which undergoes two-phase separation when mixed with the first substance in a state of solution, an alkyl chain-containing surfactant, a steroidal surfactant, a mixture of metallic and semiconducting carbon nanotubes, and a solvent, wherein the first substance and the second substance are mixed to form a single layer, and the first substance is an α-glucan which is composed of glucose linked via α-glucosidic linkage and which has a weight average molecular weight Mw of 4,000 to 7,000 and has a ratio in amount of α1, 6 linked glucose residues to the entire glucose residues of 40 to 70%. In the third embodiment, details of the first substance, the second substance, the alkyl chain-containing surfactant, the steroidal surfactant, and the carbon nanotube are the same as described in the first embodiment.

Fourth Embodiment

The fourth embodiment is directed to a dispersion for separating semiconducting carbon nanotube from a mixture of metallic and semiconducting carbon nanotubes through two-phase separation, characterized in that the dispersion comprises a first substance, a second substance which undergoes two-phase separation when mixed with the first substance in a state of solution, an alkyl chain-containing surfactant, a steroidal surfactant, a mixture of metallic and semiconducting carbon nanotubes, and a solvent, wherein the first substance is an α-glucan which is composed of glucose linked via α-glucosidic linkage and which has a weight average molecular weight Mw of 4,000 to 7,000 and has a ratio in amount of α-1, 6 linked glucose residues to the entire glucose residues of 40 to 70%, and the dispersion is separated into a first layer mainly containing the first substance and one of the semiconducting carbon nanotube and the metallic carbon nanotube, and a second layer mainly containing the second substance and the other carbon nanotube. In the fourth embodiment, details of the first substance, the second substance, the alkyl chain-containing surfactant, the steroidal surfactant, and the carbon nanotube are the same as described in the first embodiment.

Fifth Embodiment

The fifth embodiment is directed to a method for producing a dispersion, the method comprising adding a mixture of metallic and semiconducting carbon nanotubes to the mixed solution of the second embodiment, to thereby prepare the dispersion.

Sixth Embodiment

The sixth embodiment is directed to a semiconducting carbon nanotube separation method, the method comprising separating a dispersion into two layers, the dispersion being for separating semiconducting carbon nanotube from a mixture of metallic and semiconducting carbon nanotubes, characterized in that the dispersion comprises a first substance, a second substance which undergoes two-phase separation when mixed with the first substance in a state of solution, an alkyl chain-containing surfactant, a steroidal surfactant, and a mixture of metallic and semiconducting carbon nanotubes, and a solvent, wherein the first substance and the second substance are mixed to form a single layer, and the first substance is an α-glucan which is composed of glucose linked via α-glucosidic linkage and which has a weight average molecular weight Mw of 4,000 to 7,000 and has a ratio in amount of α-1, 6 linked glucose residues to the entire glucose residues of 40 to 70%, wherein the two layers are a first layer mainly containing the first substance and a second layer mainly containing the second substance, whereby the semiconducting carbon nanotube is transferred into one of the first layer and the second layer, and the metallic carbon nanotube is transferred into the other of the first layer and the second layer.

Seventh Embodiment

The seventh embodiment is directed to a semiconducting carbon nanotube separation method, characterized in that the method comprises adding a mixture of metallic and semiconducting carbon nanotubes to the mixed solution of the second embodiment, to thereby prepare a dispersion, and separating the dispersion into two layers which are a first layer mainly containing the first substance and a second layer mainly containing the second substance, whereby the semiconducting carbon nanotube is transferred into one of the first layer and the second layer, and the metallic carbon nanotube is transferred into the other of the first layer and the second layer.

Notably, the steps of the seventh embodiment can be independently carried out. For example, steps of preparing the mixed solution, preparing the dispersion, and separating the dispersion into two phases can be carried out by different subjects and sites.

There will next be described specific examples of the present disclosure with reference to the drawings. However, the present disclosure is not limited to the examples.

EXAMPLE 1

Carbon nanotube obtained through arc discharge was sampled an an amount of 2.4 mg and subjected to a dispersion treatment with 1% aqueous SC solution for 4 hours by means of a bath-type ultrasonic dispersing apparatus, to thereby prepare a carbon nanotube dispersion.

Separately, an α-glucan of interest was produced through the procedure of Example 5 disclosed in Patent Document 2 (WO 2008/136331). Specifically, to a 27.1 mass % liquefied corn starch (hydrolyzation degree: 3.6), sodium hydrogensulfite and calcium chloride were added to final concentrations of 0.3 mass % and 1 mM, respectively. The mixture was cooled to 50° C.

To the above mixture, a crude enzyme condensed liquid of α-glucosyltransferase derived from *Bacillus circulans* PP710 (FERN BP-10771) through a method disclosed in Example 1 of Patent Document 2 was added in an amount of 13.2 units per 1 g of the solid content. The enzyme was caused to act on the mixture at 50° C. and a pH 6.0 for 72 hours.

The reaction mixture was maintained at 80° C. for 60 minutes and then cooled, followed by filtration. The thus-obtained filtrate was decolored through a customary method with activated carbon and purified through desalting with H-type and OH-type ion-exchange resins. The purified product was further concentrated and spray-dried, to thereby produce an α-glucan of interest.

The thus-obtained α-glucan was analyzed through an isomalto-dextranase digestion test and an α-glucosidase/ glucoamylase digestion test (disclosed in paragraphs 0079 and 0080 of Patent Document 2), and a methylation analysis (disclosed in paragraphs 0076 to 0078 of Patent Document 2). As a result, the following properties (a) to (c) have been found.

(a) The constituent saccharide was glucose.

(b) The α-glucan had a branching structure in which a glucan (glucose polymerization degree: ≥1) linked via a linkage other than α-1, 4 linkage is attached to a non-reducing end glucose residue present at one end of a linear-chain glucan (glucose polymerization degree: ≥3) linked via α-1, 4 linkage.

(c) Isomaltose was formed through isomalto-dextranase digestion in an amount 32.7 mass % with respect to the solid content of the digestive product.

The thus-obtained α-glucan was also analyzed through the aforementioned enzyme-HPLC technique. As a result, the above branched α-glucan mixture was found to have, in addition to the aforementioned properties, the below-described property (d). Furthermore, the aforementioned methylation analysis has revealed the following properties (e) to (h).

(d) The water-soluble dietary fiber content was 85.0 mass %.

(e) The ratio in amount of α-1, 4 linked glucose residues to α-1, 6 linked glucose residues was 1:3.4.

(f) The ratio in amount of the sum of α-1, 4 linked glucose residues and α-1, 6 linked glucose residues to the entire glucose residues was 66.7%.

(g) The ratio in amount of α-1, 3 linked glucose residues to the entire glucose res dues was 2.8%.

(h) The ratio in amount of α-1, 3, 6 linked glucose residues to the entire glucose residues was 7.6%.

Further, the α-glucan was analyzed in terms of molecular weight distribution through gel filtration HPLC as disclosed in paragraph 0081 of Patent Document 2. As a result, the weight average molecular weight (Mw) was found to be 5,110 Da (about 31 as reduced to average glucose polymerization degree) and Mw/Mn was found to be 2.1.

As described above, the α-glucan employed in Example 1 was characterized in that the constituent saccharide was glucose; the α-glucan had a branching structure in which a glucan (glucose polymerization degree: ≥1) linked via a linkage other than α-1, 4 linkage is attached to a non-reducing end glucose residue of a linear-chain glucan (glucose polymerization degree: ≥3) linked via α-1, 4 linkage; and isomaltose was formed through isomalto-dextranase digestion in an amount 25 mass % to 50 mass % with respect to the solid content of the digestive product. Also, the α-glucan employed in Example 1 was characterized in that the water-soluble dietary fiber content was 40 mass % or higher; the ratio in amount of α-1, 4 linked glucose residues to α-1, 6 linked glucose residues was 1:0.6 to 1:4; and the ratio in amount of the sum of α-1, 4 linked glucose residues and α-1, 6 linked glucose residues to the entire glucose residues was ≥60%.

Further, the αglucan employed in Example 1 was characterized in that the ratio in amount of α-1, 3 linked glucose residues to the entire glucose residues was 0.5% or higher and lower than 10%; and the ratio in amount of α-1, 3, 6 linked glucose residues to the entire glucose residues was 0.5% or higher.

Next, the α-glucan aqueous solution of interest as prepared through the aforementioned method (200 μL), aqueous PEG (80 μL), aqueous SDS (40 μL), and aqueous SC (90 μL) were mixed together, to thereby prepare a mixed solution. The α-glucan concentration, PEG concentration, SDS concentration, and SC concentration were adjusted to 20 wt %, 50 wt %, 2 wt %, and 3.35 wt %, respectively.

Subsequently, a carbon nanotube dispersion (90 μL) was added to the mixed solution, and the resultant mixture was stirred, to thereby prepare a dispersion. The dispersion was allowed to stand for 15 minutes. Thereafter, the dispersion was centrifuged (4000 q, 5 minutes). As a result, the dispersion was separated into two layers; an upper layer mainly containing PEG and a lower layer mainly containing α-glucan.

Then, the upper layer mainly containing PEG was removed from the dispersion, and the absorption spectrum of thereof was measured.

COMPARATIVE EXAMPLE 1

The same procedure as employed in Example 1 was performed, except that DX was used instead of α-glucan, to thereby separate the dispersion into two layers. The upper layer mainly containing PEG was removed, and the absorption spectrum thereof was measured.

COMPARATIVE EXAMPLE 2

The α-glucan employed in Example 1 was subjected to an enzyme treatment with glucoamylase, to thereby lower the ratio in amount of α-1, 6 linked glucose residues to the entire glucose residues to <40%. Then, the procedure of Example 1 was repeated, except that the enzyme-treated α-glucan was used instead of α-glucan, to thereby separate the dispersion into two layers. The upper layer mainly containing PEG was removed, and the absorption spectrum thereof was measured.

COMPARATIVE EXAMPLE 3

Before separation of the dispersion prepared in Example 1 into two layers, the absorption spectrum of the dispersion was measured.

Figure 3:
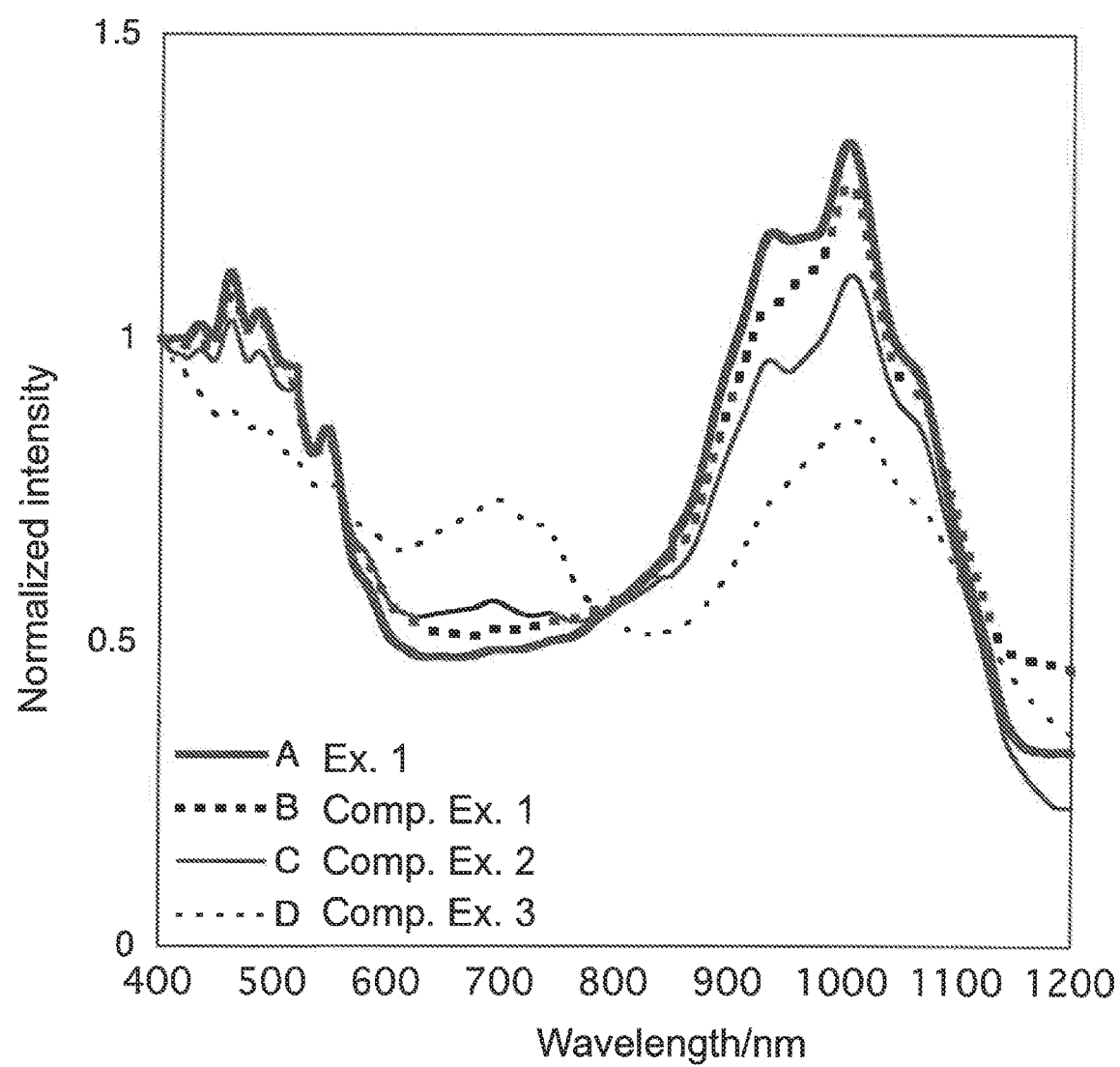
FIG. 3 Absorption spectra of the PEG layers obtained in Example 1 and Comparative Examples 1 and 2, and an absorption spectrum of the dispersion of Comparative Example 3.

FIG. 3 shows a graph showing absorption spectra of the PEG layers obtained in Example 1 and Comparative Examples 1 and 2, and an absorption spectrum of the dispersion of Comparative Example 3. As shown in FIG. 3, the absorption spectrum of Comparative Example 3 was measured before separation of the dispersion into two layers. Thus, metallic and semiconducting carbon nanotubes are co-present in the dispersion. As a result, both of an absorption band (600 to 800 nm) attributed to metallic carbon nanotube and an absorption band (820 to 1,040 nm) attributed to semiconducting carbon nanotube were observed.

In contrast, in Example 1 and Comparative Examples 1 and 2, the upper layer of the dispersion after separation exhibited a weaker absorption band (600 to 800 nm) attributed to metallic carbon nanotube and a stronger absorption band (850 to 1,100 nm) attributed to semiconducting carbon nanotube, as compared with the case of Comparative Example 3 (before separation). Thus, the spectral features have revealed that semiconducting carbon nanotube is isolated in the upper layer.

However, semiconducting carbon nanotube separation performance was found to vary among Example 1 and Comparative Examples 1 and 2.

Table 1 shows the intensity of the spectral peak attributed to semiconducting carbon nanotube, that attributed to metallic carbon nanotube, and the intensity ratio determined in absorption spectra of Example 1 and Comparative Examples 1 to 3.

TABLE 1

| | Intensity (semiconducting CNT) [Is] | Intensity (metallic CNT) [Im] | Intensity ratio [Is/Im] |
|---|---|---|---|
| Ex. 1 (α-glucan) | 1.32 | 0.49 | 2.72 |
| Comp. Ex. 1 (dextran) | 1.26 | 0.52 | 2.40 |
| Comp. Ex. 2 (enzyme-treated α-glucan) | 1.10 | 0.57 | 1.94 |
| Comp. Ex. 3 (dispersion) | 0.87 | 0.74 | 1.18 |

In comparison of Example 1 with Comparative Example 1, as shown in Table 1, the intensity of the spectral peak attributed to metallic carbon nanotube (at 695 nm) (IM) was lower in Example 1 than in Comparative Example 1 by 0.03, and that attributed to semiconducting carbon nanotube (at 1,004 nm) (Is) was higher in Example 1 than in Comparative Example 1 by 0.06. The intensity ratio (Is/Im) was 2.72 in Example 1 and 2.40 in Comparative Example 1. Thus, when a specific α-glucan was used instead of DX, semiconducting carbon nanotube separation performance was equivalent to or higher than that in the case of DX.

In comparison of Example 1 with Comparative Examples 1 and 2, as shown in Table 1, the intensity of the spectral peak attributed to metallic carbon nanotube (at 695 nm) (Im) was higher in Comparative Example 2 than in Example 1 and Comparative Example 1, by 0.05 to 0.08, and that attributed to semiconducting carbon nanotube (at 1,004 nm) (Is) was considerably lower in Comparative Example 2 than in Example 1 and Comparative Example 1, by 0.16 to 0.22. The intensity ratio (Is/Im) was 1.94. Thus, semiconducting carbon nanotube separation performance in Comparative Example 2 was reduced as compared with that determined in Example 1 and Comparative Example 1. As a result, when the ratio in amount of α-1, 6 linked glucose residues to the entire glucose residues was 40% or higher, a semiconducting carbon nanotube separation performance was equivalent to or higher than that of DX.

As described hereinabove, in Example 1, semiconducting carbon nanotube was isolated in the upper layer mainly containing PEG, and the semiconducting carbon nanotube separation performance was equivalent to or higher than that of DX. Also, since α-glucan used in Example 1 is less expensive than DX, semiconducting carbon nanotube separation was achieved at low cost.

EXAMPLE 2

A specific α-glucan prepared through the method described in Example 1 was mixed with an aqueous solution, to thereby prepare an α-glucan aqueous solution. Within the same day, a portion of the thus-prepared α-glucan aqueous solution was sampled. The thus-sampled α-glucan aqueous solution (200 μL), PEG aqueous solution (80 μL), SDS aqueous solution (40 μL), and sodium glycocholate (SGC) aqueous solution (90 μL) were mixed together, to thereby prepare a mixed solution. The α-glucan concentration, PEG concentration, SDS concentration, and SC concentration were adjusted to 20 wt %, 50 wt %, 2 wt %, and 3.35 wt %, respectively.

Subsequently, a carbon nanotube dispersion (90 μL) was added to the mixed solution, and the resultant mixture was stirred, to thereby prepare a dispersion. The resultant dispersion was allowed to stand for 15 minutes. Then, the dispersion was centrifuged (4,000 g, 5 minutes), to thereby separate the dispersion into two layers; an upper layer mainly containing PEG and a lower layer mainly containing α-glucan.

Then, the upper layer mainly containing PEG was removed, and the absorption spectrum thereof was measured.

Also, the remaining α-glucan aqueous solution was allowed to stand at room temperature for 18 days. Then, a mixed solution was prepared in the same manner as described above, and a carbon nanotube dispersion was added to the mixed solution, to thereby separate the solution into two layers. The PEG-containing upper layer was removed, and the absorption spectrum thereof was measured.

COMPARATIVE EXAMPLE 4

The procedure of Example 2 was repeated, except that DX was used instead of the specific α-glucan, to thereby prepare a DX aqueous solution. By use of the DX aqueous solutions (as-prepared (day 1) and 18 days after preparation (day 18)), each solution was separated in the same manner as employed in Example 2. The absorption spectrum of the PEG-containing upper layer was measured. The DX aqueous solution was allowed to stand under the same conditions as employed in Example 2.

Figure 4:
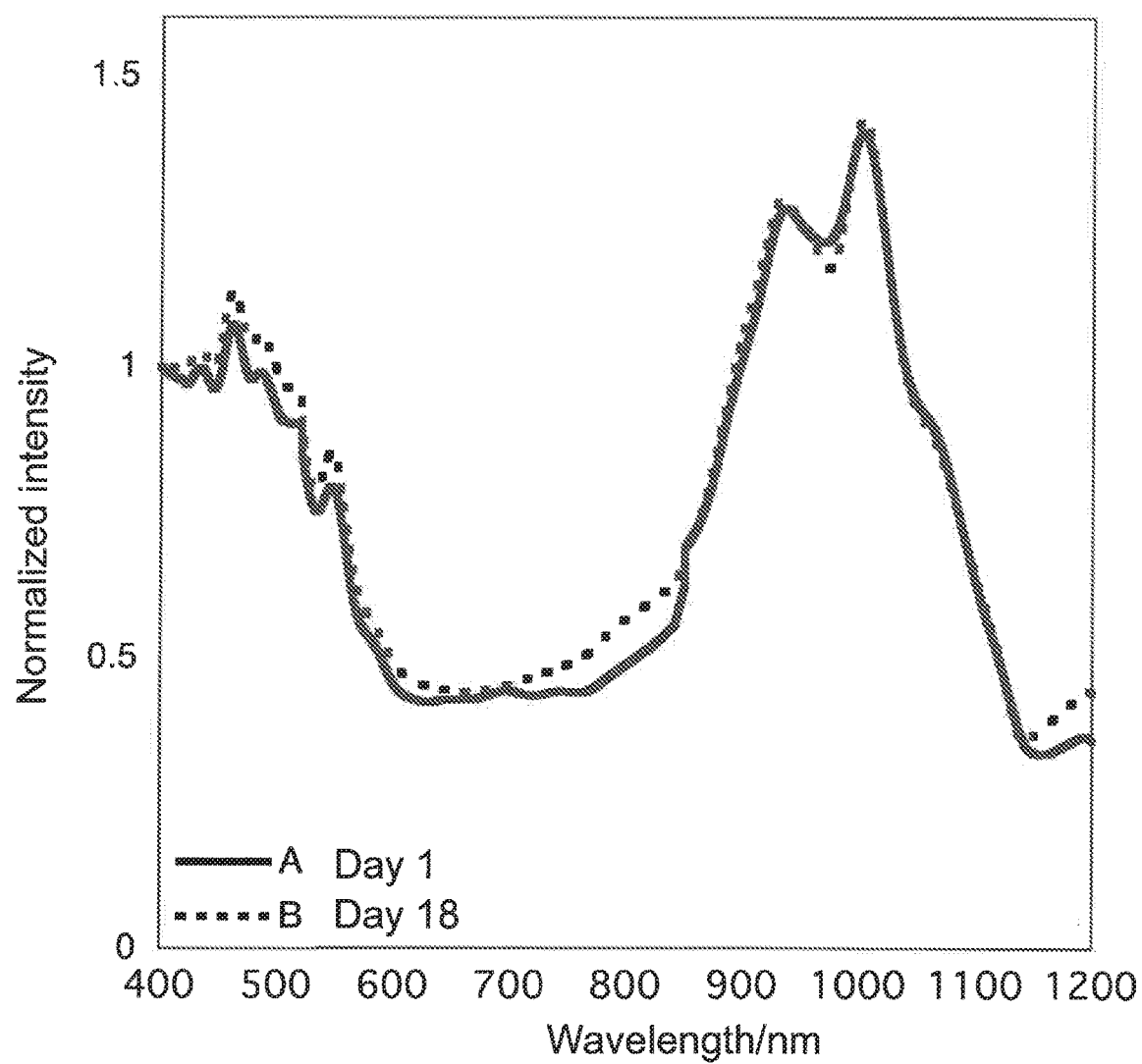
FIG. 4 Absorption spectra of the PEG layer obtained in Example 2.
Figure 5:
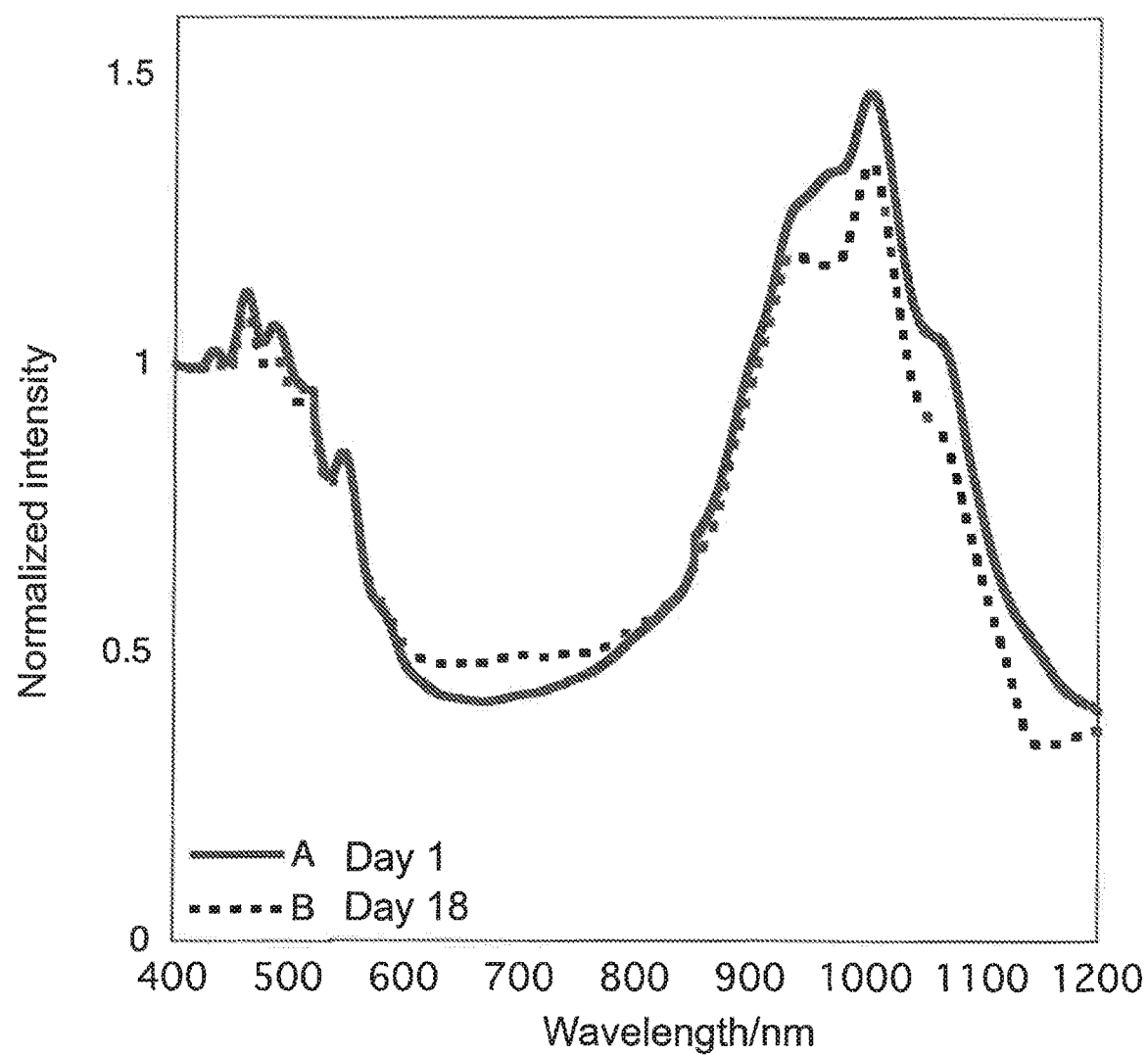
FIG. 5 Absorption spectra of the PEG layer obtained in Comparative Example 4.

FIG. 4 shows absorption spectra of the PEG layer obtained in Example 2, and FIG. 5 shows those obtained in Comparative Example 4. Table 2 shows the intensity of the spectral peak attributed to semiconducting carbon nanotube, that attributed to metallic carbon nanotube, and the intensity ratio determined in absorption spectra of Example 2 and Comparative Example 4.

TABLE 2

| | After Preparation | Intensity (semi-conducting CNT) [Is] | Intensity (metallic CNT) [Im] | Intensity ratio [Is/Im] | Deterioration [%] |
|---|---|---|---|---|---|
| Ex. 2 (α-glucan) | Day 1 | 1.40 | 0.44 | 3.182 | <1 |
| | Day 18 | 1.43 | 0.45 | 3.177 | |
| Comp. Ex. 4 (dextran) | Day 1 | 1.47 | 0.43 | 3.42 | 21 |
| | Day 18 | 1.35 | 0.50 | 2.70 | |

As shown in FIG. 4, in Example 2 (employing specific α-glucan), neither an absorption band (600 to 800 nm) attributed to metallic carbon nanotube nor an absorption band (850 to 1,100 am) attributed to semiconducting carbon nanotube were significantly changed between day 1 and day 18. As shown in Table 2, the intensity ratio Is/Im; i.e., a ratio of the intensity of the spectral peak attributed to semiconducting carbon nanotube (at 1,004 nm) (Is) to that attributed to metallic carbon nanotube (at 695 nm) (Im), was 3.182 (day 1) and 3,177 (day 18). The percent deterioration of intensity ratio Is/Im was less than 1%.

In contrast, as shown in FIG. 5, in Comparative Example 4 (employing DX), the absorption band (600 to 800 nm) attributed to metallic carbon nanotube increased, and the absorption band (850 to 1,100 nm) attributed to semiconducting carbon nanotube decreased, between day 1 and day 18. As shown in Table 2, the intensity ratio Is/Im was 3.42 (day 1) and 2.70 (day 18). The percent deterioration of intensity ratio Is/Im was 21%.

Thus, in Comparative Example 4 (employing DX), the intensity ratio Is/Im (i.e., semiconducting carbon nanotube separation performance) decreased over time, whereas, in Example 2 (employing specific α-glucan), the intensity ratio Is/Im did not significantly change, indicating highly consistent semiconducting carbon nanotube separation performance. Therefore, in the case where a specific α-glucan was used in Example 2, even when the solution was repeatedly used in semiconducting carbon nanotube separation, decrease in separation performance was not significant, indicating excellent solution reusability.

EXAMPLE 3

The specific α-glucan employed in Example 1 (hereinafter referred to as IMD) was fractionated through size exclusion chromatography into low-molecular weight IMD (hereinafter referred to as S-IMD) and high-molecular weight IMD (hereinafter referred to as L-IMD) Separately, glucoamylase was caused to act on IMD, to thereby hydrolyze continuously present α-1, 6 linkages at the non-reducing ends of IMD. The thus-formed glucose was removed, to thereby prepare IMD in which a portion extending to the branching point was selectively deleted (hereinafter referred to as E-IMD). The weight average molecular weight Mw (Da) and the number average molecular weight Mn (Da) of each of IMD, E-IMD, S-IMD, and L-IMD were determined through gel permeation chromatography. The α-glucosidic linkage content (%) was determined through a methylation analysis. Table 3 shows the results.

TABLE 3

|  | IMD | E-IMD | S-IMD | L-IMD |
|---|---|---|---|---|
| Wt. av. mol. wt. Mw (Da) | 5,110 | 4,020 | 2,510 | 6,170 |
| No. av. mol. wt. Mn (Da) | 2,490 | 2,470 | 1,940 | 4,700 |
| Mw/Mn | 2.1 | 1.6 | 1.3 | 1.3 |
| α-Glucoside linkage content (%) |  |  |  |  |
| Non-reducing end | 15.6 | 15.3 | 15.3 | 9.6 |
| 1,3-linkage | 2.8 | 6.9 | 7.4 | 3.5 |
| 1,4-linkage | 15.2 | 19.4 | 17.1 | 20.4 |
| 1,6-linkage | 51.5 | 38.1 | 51.4 | 45.4 |
| 1,3,6-linkage | 7.6 | 12.5 | 7.5 | 11.6 |
| 1,4,6-linkage | 7.2 | 7.8 | 5.3 | 9.5 |
| Entire 1,6-linkage | 66.3 | 58.4 | 64.2 | 66.5 |

As shown in Table 3, since E-IMD (i.e., partially deleted IMD) was formed by hydrolyzing continuously present α-1, 6 linkages at the non-reducing ends of IMD, the α-1, 6 linkage content was lower than that of IMD, and the weight average molecular weight Mw was reduced. S-IMD had a weight average molecular weight Mw lower than that of IMD, and L-IMD had a weight average molecular weight Mw higher than that of IMD. S-IMD and L-IMD had almost the same α-glucosidic linkage content as that of IMD, but had a high α-1, 6 linkage content and a considerably low Mw/Mn of 1.3.

By use of each of the four IMD species shown in Table 3, the procedure of Example 1 was repeated, to thereby prepare dispersons. Each dispersion was separated into two layers; i.e., an upper layer mainly containing PEG and a lower layer mainly containing IMD. The upper layer of the dispersion was removed, and the absorption spectrum thereof was measured. For comparison, the same procedure was repeated, except that pullulan (PUL) was usedinstead of IMD, to thereby obtain the absorption spectrum. Pullulan is a polysaccharide in which glucose units are linked via α-glucosidic linkage, and has a structure in which a sequence of α-1, 4 linkage, α-1, 4 linkage, and α-1, 6 linkage is repeated.

Figure 6:
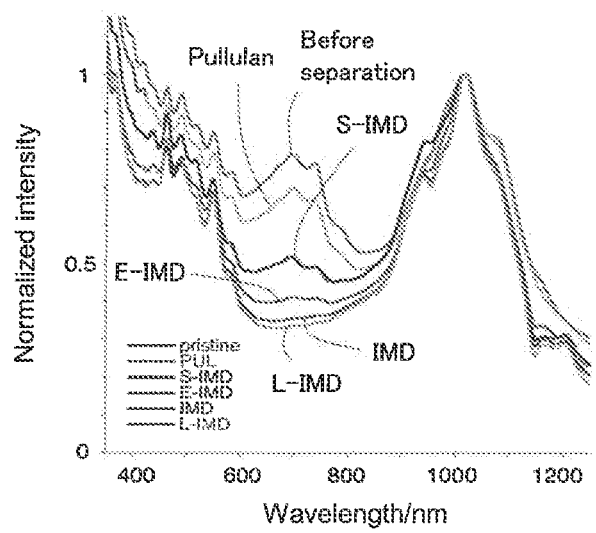
FIG. 6 Absorption spectra of the dispersions obtained in Example 3.

FIG. 6 shows absorption spectra of the dispersions (upper layers). In the case of carbon nanotube having a diameter of 1.4 to 1.6 nm, the absorption peak ranging from 900 to 1,100 nm is attributed to semiconducting carbon nanotube, and the absorption peak ranging from 600 to 800 nm is attributed to metallic carbon nanotube. As the absorption at 600 to 800 nm is smaller, the semiconducting carbon nanotube separation performance can be conceivably higher.

As shown in FIG. 6, in comparison of IMD with L-IMD, the absorption (600 to 800 nm) of L-IMD was slightly lower. That is, the semiconducting carbon nanotube separation performance of L-IMD was slightly higher than that of IMD. In comparison of IMD with S-IMD, the absorption (600 to 800 nm) of S-IMD was greater. That is, the semiconducting carbon nanotube separation performance of S-IMD was lower than that of IMD. As shown in Table 3, IMD, L-IMD, and S-IMD have almost the same α-glucosidic linkage content. Therefore, difference in separation performance among IMD, L-IND, and S-IMD has been proven to be attributed to difference in weight average molecular weight Mw. The above results have proven that a weight average molecular weight Mw higher than a certain level is required for the enhancement of semiconducting carbon nanotube separation performance. In addition, the higher the weight average molecular weight Mw of IMD, the higher the semiconducting carbon nanotube separation performance.

Also, through comparison of the above spectra with conventionally reported absorption spectra, the purity of semiconducting carbon nanotube (i.e., the ratio of semiconducting carbon nanotube to the entire carbon nanotubes in dispersion) was estimated. As a result, the purity was estimated at about 98% in the case of IMD and about 99% in the case of L-IMD, which are remarkably high levels of purity.

Figure 7:
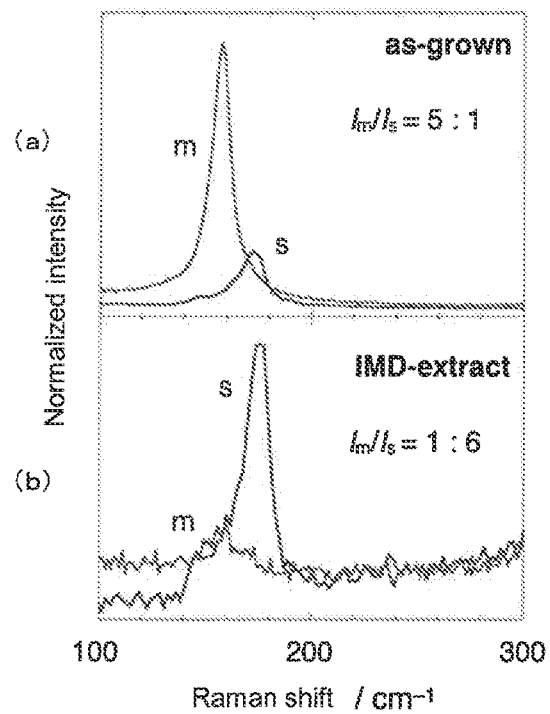
FIG. 7 Raman spectra of the dispersions.

In the case of IMD, the purity of semiconducting carbon nanotube was evaluated through Raman spectrometry. FIG. 7(*a*) is a Raman spectrum of a dispersion of unpurified (as-grown) carbon nanotube before separation, and FIG. 7(*b*) is a Raman spectrum of a carbon nanotube dispersion after separation by use of IMD. In each Raman spectrum, two peaks in the radial breathing mode were observed. The peak (m) observed at about 160 cm$^{-1}$ in excitation at 532 nm corresponds to a peak attributed to metallic carbon nanotube, and the peak (s) observed at about 180 cm$^{-1}$ in excitation at 785 nm corresponds to a peak attributed to semiconducting carbon nanotube.

In comparison of FIG. 7(*a*) with FIG. 7(*b*), the peak attributed to metallic carbon nanotube in the separated dispersion considerably decreased. The peak intensity ratio of metallic carbon nanotube peak intensity Im to semiconducting carbon nanotube peak intensity Is was 5:1 before separation and 1:6 after separation. Assuming that the ratio of metallic carbon nanotube to semiconducting carbon nanotube before separation is 1:2, the purity of semiconducting carbon nanotube after separation was estimated to be 98.4%. This value coincided with the purity estimated from absorption spectra.

In comparison of IMD with E-IMD with reference to FIG. 6, the absorption (600 to 800 nm) was greater in the case of E-IMD, and the semiconducting carbon nanotube separation performance was lower in the case of E-IMD than in the case of IMD. When pullulan was used, the absorption (600 to 800 nm) was not substantially reduced after separation of the carbon nanotube dispersion, indicating failure to separate semiconducting carbon nanotube. Notably, E-IMD (i.e., partially deleted IMD) was formed by breaking continuously present α-1, 6 linkages at the non-reducing ends of IMD, and pullulan has no continuous α-1, 6 linkage sequence. Therefore, the continuous α-1, 6 linkage sequence of IMD was found to play an important role in enhancing semiconducting carbon nanotube separation performance.

As described hereinabove, Example3 has revealed that IMD must have the following two structural features for enhancing semiconducting carbon nanotube separation performance. Specifically, the first feature is a great weight average molecular weight Mw of IMP (i.e., a long-chain IMD), and the second feature is the presence of continuous α-1, 6 linkage sequence.

EXAMPLE 4

Figure 8:
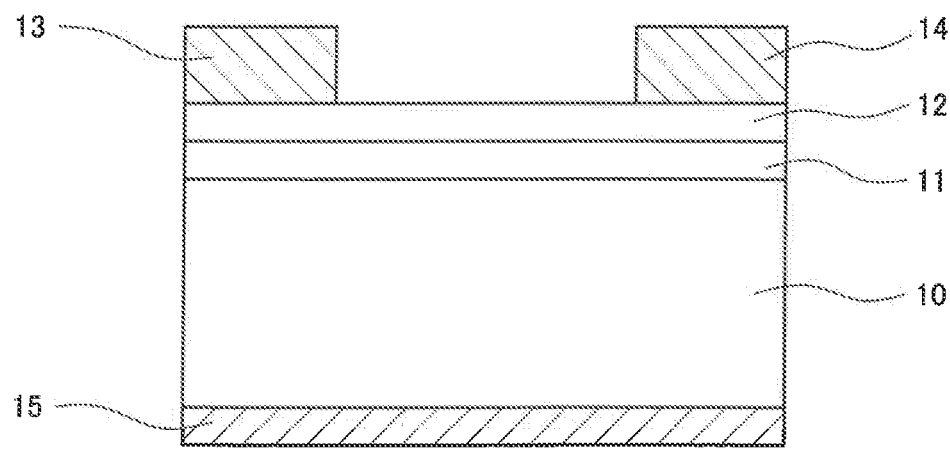
FIG. 8 Schematic configuration of a thin-film transistor.

By use of the semiconducting carbon nanotube isolated in Example 1, a thin-film transistor was fabricated through the following procedure. FIG. 8 shows the structure of the thin-film transistor. As shown in FIG. 8, the thin-film transistor had an Si substrate 10, a thermal oxide film 11 formed on the Si substrate 10, a semiconductor layer 12 containing the semiconducting carbon nanotube and formed on the thermal oxide film 11, a source electrode 13 and a drain electrode 14 which were disposed with spacing on the semiconductor layer 12, and a gate electrode 15 formed on the back surface of the Si substrate 10.

Firstly, among the two layers of dispersion obtained through the method of Example 1, the upper-layer dispersion containing semiconducting carbon nanotube was removed, and an equivolume of 1 wt % SC aqueous solution was added thereto so that semiconducting carbon nanotubes were dispersed without aggregation.

Then, the resultant dispersion was applied onto the surface of the Si substrate 10 where the thermal oxide film. 11 was formed. The surface of the thermal oxide film 11 had been modified in advance with amino groups, and carbon nanotubes contained in the dispersion were bound to the surface of the thermal oxide film 11 by the mediation of the amino groups. Subsequently, the thus-prepared sample was allowed to stand for 1 hour and dried through blowing of nitrogen gas, to thereby remove the solution. Next, the surface of the thermal oxide film 11 was washed with water and isopropyl alcohol, to thereby remove surfactants (SDS and SC) contained in the dispersion. Thus, the semiconductor layer 12 containing the semiconducting carbon nanotube was formed on the thermal oxide film 11.

Then, the source electrode 13 (Au) and the drain electrode 14 (Au) were formed on the semiconductor substrate 12 so that the two electrodes were separated from each other at a predetermined distance. On the back surface of the Si substrate 10, the gate electrode 15 (Au) was formed. Patterning and formation of these electrodes were carried out through photolithography and vapor deposition. Subsequently, the portion of the semiconductor layer 12 other than a channel region was removed through photolithography and oxygen plasma. Thus, the thin-film transistor shown in FIG. 8 was fabricated.

Figure 9:
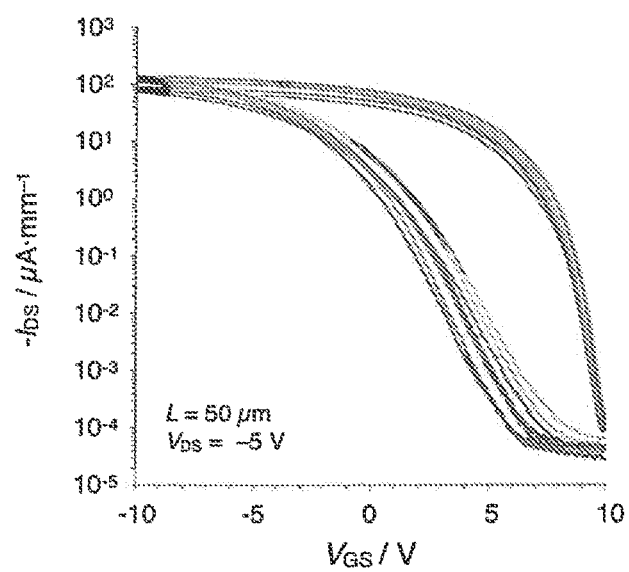
FIG. 9 Graph showing current-voltage characteristics of the thin-film transistor.

The current-voltage characteristics of the thus-fabricated thin-film transistor were assessed. FIG. 9 is a graph showing the relation between current density (μA/mm) and source-gate voltage of −5 V at a channel length of 50 μm and a source-drain voltage of −5 V. In the specific procedure, nine thin-film transistor samples were produced. FIG. 9 shows the current-voltage characteristics of the transistor samples.

As shown in FIG. 9, the thin-film transistor (9 samples) had a p-type character. The characteristic values (average of nine thin-film transistor samples) were as follows: on-off ratio of $2.75 \times 10^6$, carrier mobility of 4.21 $cm^2/V \cdot s$, and on current density of 111 μA/mm, which were remarkably higher than those conventionally attained. As a result, semiconducting carbon nanotube was found to be separated at high purity though the method of Example 1.

Figure 10:
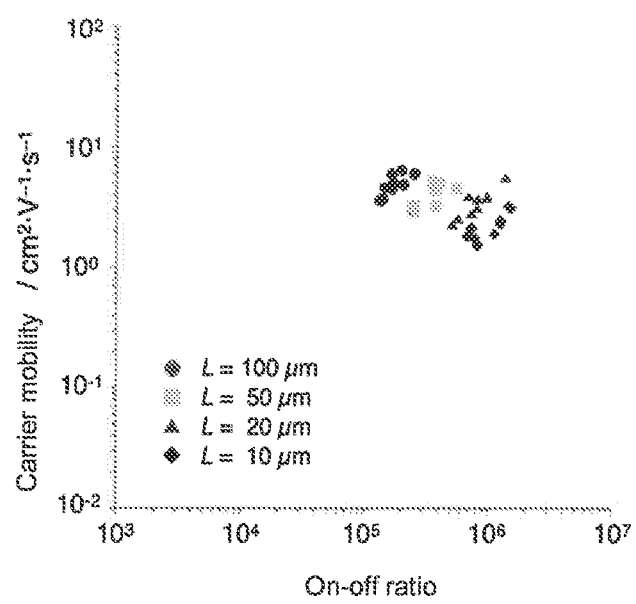
FIG. 10 Graph showing distribution of on-off ratio and carrier mobility.

Through employing various channel lengths (10, 20, 50, and 100 μm), a number of thin-film transistor samples were provided. When the source-drain voltage was tuned at −5 V, on-off ratio and carrier mobility were measured. FIG. 10 shows the results. As is clear from FIG. 10, variation in the characteristics was considerably small, indicating that the semiconductor layer 12 has remarkably high uniformity.

INDUSTRIAL APPLICABILITY

According to the carbon nanotube separation method of the present disclosure, high-purity semiconducting carbon nanotuhe can be recovered. The carbon nanotuhe can be used as a material of various semiconductor devices.

DESCRIPTION OF REFERENCE NUMBERS

10: Si substrate
11: thermal oxide film
12: semiconductor layer
13: source electrode
14: drain elecrode
15: gate electrode

The invention claimed is:

1. A semiconducting carbon nanotube separation method characterized in that the method comprises
    a first step of mixing a first substance, a second substance which undergoes two-phase separation when mixed with the first substance in a state of solution, an alkyl chain-containing surfactant, a steroidal surfactant, and a mixture of metallic and semiconducting carbon nanotubes with a solvent, to thereby prepare a dispersion; and
    a second step of separating the dispersion into two layers, which are a first layer mainly containing the first substance and a second layer mainly containing the second substance, whereby the semiconducting carbon nanotube is transferred into one of the first layer and the second layer, and the metallic carbon nanotube is transferred into the other of the first layer and the second layer, wherein
    the first substance is an α-glucan which is composed of glucose linked via α-glucosidic linkage and which has a weight average molecular weight Mw of 4,000 to 7,000 and has a ratio in amount of α-1,6 linked glucose residues to the entire glucose residues of 40 to 70%.

2. The semiconducting carbon nanotube separation method according to claim 1, wherein the first step includes
    mixing the first substance, the second substance, the alkyl chain-containing surfactant, and the steroidal surfactant with the solvent, to thereby prepare a mixed solution; and,
    subsequently, adding the mixture of metallic and semiconducting carbon nanotubes to the mixed solution, to thereby prepare a dispersion.

3. The semiconducting carbon nanotube separation method according to claim 1, wherein the first substance is an α-glucan having a structure in which glucose units are continuously linked via α-1,6 linkages.

* * * * *